United States Patent
Fujita et al.

(10) Patent No.: US 11,398,574 B2
(45) Date of Patent: Jul. 26, 2022

(54) SOLAR CELL AND SOLAR CELL MODULE

(71) Applicant: Panasonic Corporation, Osaka (JP)

(72) Inventors: Kazunori Fujita, Osaka (JP); Kenta Matsuyama, Osaka (JP)

(73) Assignee: PANASONIC HOLDINGS CORPORATION, Osaka (JP)

(*) Notice: Subject to any disclaimer, the term of this patent is extended or adjusted under 35 U.S.C. 154(b) by 0 days.

(21) Appl. No.: 16/829,934

(22) Filed: Mar. 25, 2020

(65) Prior Publication Data

US 2020/0313009 A1 Oct. 1, 2020

(30) Foreign Application Priority Data

Mar. 26, 2019 (JP) ............... JP2019-059393

(51) Int. Cl.
  *H01L 31/0352* (2006.01)
  *H01L 31/0236* (2006.01)
  (Continued)

(52) U.S. Cl.
  CPC .. *H01L 31/03529* (2013.01); *H01L 31/02363* (2013.01); *H01L 31/0504* (2013.01);
  (Continued)

(58) Field of Classification Search
  CPC ........... H01L 31/03529; H01L 31/0504; H01L 31/02363; H01L 31/0747; H01L 31/202;
  (Continued)

(56) References Cited

U.S. PATENT DOCUMENTS

2004/0182433 A1* 9/2004 Terakawa ............ H01L 31/076 136/255
2005/0205960 A1* 9/2005 Nagashima ..... H01L 31/022441 257/486
(Continued)

FOREIGN PATENT DOCUMENTS

WO 2016/194301 12/2016
WO 2018/180227 A1 10/2018

OTHER PUBLICATIONS

Daniela E.Ortíz-Ramos "p-Type transparent Cu doped ZnS thin films by the chemical bath deposition method" Materials Letters124(2014)267-270 (Year: 2014).*
(Continued)

*Primary Examiner* — Michael Y Sun
(74) *Attorney, Agent, or Firm* — McDermott Will & Emery LLP

(57) ABSTRACT

A solar cell includes: a semiconductor substrate which includes a first principal surface and a second principal surface; a first semiconductor layer of the first conductivity type disposed above the first principal surface; and a second semiconductor layer of a second conductivity type disposed below the second principal surface. The semiconductor substrate includes: a first impurity region of the first conductivity type; a second impurity region of the first conductivity type disposed between the first impurity region and the first semiconductor layer; and a third impurity region of the first conductivity type disposed between the first impurity region and the second semiconductor layer. A concentration of an impurity in the second impurity region is higher than a concentration of the impurity in the third impurity region, and the concentration of the impurity in the third impurity region is higher than a concentration of the impurity in the first impurity region.

11 Claims, 6 Drawing Sheets

(51) Int. Cl.
*H01L 31/05* (2014.01)
*H01L 31/0747* (2012.01)
*H01L 31/20* (2006.01)
*H01L 21/02* (2006.01)
*H01L 21/22* (2006.01)
*H01L 21/3215* (2006.01)
*H01L 21/4757* (2006.01)
*H01L 29/10* (2006.01)
*H01L 27/146* (2006.01)
*H01L 29/06* (2006.01)
*H01L 21/38* (2006.01)
*H01L 29/36* (2006.01)
*H01L 21/04* (2006.01)

(52) U.S. Cl.
CPC ........ *H01L 31/0747* (2013.01); *H01L 31/202* (2013.01); *H01L 21/0251* (2013.01); *H01L 21/0257* (2013.01); *H01L 21/02584* (2013.01); *H01L 21/046* (2013.01); *H01L 21/0415* (2013.01); *H01L 21/22* (2013.01); *H01L 21/2205* (2013.01); *H01L 21/3215* (2013.01); *H01L 21/32155* (2013.01); *H01L 21/38* (2013.01); *H01L 21/47576* (2013.01); *H01L 27/14616* (2013.01); *H01L 29/0615* (2013.01); *H01L 29/105* (2013.01); *H01L 29/1041* (2013.01); *H01L 29/365* (2013.01)

(58) Field of Classification Search
CPC ............. H01L 21/0251; H01L 21/0257; H01L 21/02584; H01L 21/0415; H01L 21/046; H01L 21/22; H01L 21/2205; H01L 21/3215; H01L 21/32155; H01L 21/38; H01L 21/47576; H01L 27/14616; H01L 29/0615; H01L 29/1041; H01L 29/105; H01L 29/365; H01L 31/1804; H01L 31/022425; H01L 31/0288; H01L 31/042; Y02E 10/547; Y02P 70/50
See application file for complete search history.

(56) References Cited

U.S. PATENT DOCUMENTS

| | | | |
|---|---|---|---|
| 2014/0020752 A1* | 1/2014 | Arimoto | H01L 31/0747 136/256 |
| 2014/0154834 A1* | 6/2014 | Bateman | H01L 33/025 438/87 |
| 2016/0118508 A1* | 4/2016 | Bock | H01L 31/02168 136/256 |
| 2017/0133538 A1* | 5/2017 | Gloger | H01L 21/223 |
| 2018/0076340 A1 | 3/2018 | Baba | |
| 2019/0259885 A1* | 8/2019 | Yoshikawa | H01L 31/02167 |
| 2019/0386160 A1 | 12/2019 | Seno et al. | |

OTHER PUBLICATIONS

Extended European Search Report issued in corresponding European Patent Application No. 20164275.8, dated May 13, 2020.

* cited by examiner

SOLAR CELL AND SOLAR CELL MODULE

CROSS REFERENCE TO RELATED APPLICATION

This application claims the benefit of priority of Japanese Patent Application Number 2019-059393, filed on Mar. 26, 2019, the entire content of which is hereby incorporated by reference.

TECHNICAL FIELD

The present disclosure relates to a solar cell and a solar cell module.

BACKGROUND ART

A solar cell has been expected to be a new energy source since the solar cell can directly convert clean and unlimited sunlight into electric power.

CITATION LIST

Patent Literature

PTL 1: International Publication No. 2016/194301

SUMMARY

Technical Problem

Further improvement in power generation characteristics of a solar cell is in demand. An aspect of the present invention provides a solar cell and a solar cell module which have improved power generation characteristics.

Solution to Problem

A solar cell according to an aspect of the present invention includes: a semiconductor substrate of a first conductivity type which includes a first principal surface and a second principal surface on a back side of the first principal surface; a first semiconductor layer of the first conductivity type disposed above the first principal surface; and a second semiconductor layer of a second conductivity type disposed below the second principal surface, the second conductivity type being different from the first conductivity type. The semiconductor substrate includes: a first impurity region of the first conductivity type; a second impurity region of the first conductivity type disposed between the first impurity region and the first semiconductor layer; and a third impurity region of the first conductivity type disposed between the first impurity region and the second semiconductor layer. A concentration of an impurity of the first conductivity type in the second impurity region is higher than a concentration of an impurity of the first conductivity type in the third impurity region, and the concentration of the impurity of the first conductivity type in the third impurity region is higher than a concentration of an impurity of the first conductivity type in the first impurity region.

In addition, a solar cell according to an aspect of the present invention includes: a semiconductor substrate of a first conductivity type which includes a light receiving surface and a back surface; a first semiconductor layer of the first conductivity type disposed in a first region below the back surface; and a second semiconductor layer of a second conductivity type disposed in a second region different from the first region below the back surface, the second conductivity type being different from the first conductivity type. The semiconductor substrate includes: a first impurity region of the first conductivity type; a second impurity region of the first conductivity type disposed between the first impurity region and the first semiconductor layer; and a third impurity region of the first conductivity type disposed between the first impurity region and the second semiconductor layer. A concentration of an impurity of the first conductivity type in the second impurity region is higher than a concentration of an impurity of the first conductivity type in the third impurity region, and the concentration of the impurity of the first conductivity type in the third impurity region is higher than a concentration of an impurity of the first conductivity type in the first impurity region.

In addition, a solar cell module according to an aspect of the present invention includes: a solar cell string in which a plurality of solar cells are electrically connected in series via a plurality of line members. Each of the plurality of solar cells is the solar cell according to the above.

Advantageous Effect

According to an aspect of the present invention, it is possible to provide a solar cell and a solar cell module which have improved power generation characteristics.

BRIEF DESCRIPTION OF THE DRAWINGS

The figures depict one or more implementations in accordance with the present teaching, by way of examples only, not by way of limitations. In the figures, like reference numerals refer to the same or similar elements.

DETAILED DESCRIPTION

Hereinafter, a solar cell and a solar cell module according to the embodiments of the present invention will be described in detail with reference to the drawings. The embodiments described below each illustrate a specific example of an aspect of the present invention. Therefore, the numerical values, shapes, materials, structural elements, the arrangement and the connection of the structural elements, and processes etc. illustrated in the following embodiments are not intended to limit an aspect of the present invention. Consequently, among the structural elements in the following embodiments, those not recited in any of the independent claims representing the most generic concepts are described as optional structural elements.

The drawings are schematic diagrams and do not necessarily provide strictly accurate illustrations. Throughout the drawings, the same numeral is given to substantially the same structural component.

In this specification, the "front surface" of a solar cell indicates a surface through which a greater amount of light is allowed to pass to enter the solar cell (more than 50% to 100% of light enters from the front surface), compared to the "back surface" of the solar cell which is a surface opposite to the front surface of the solar cell. Note that the specification also includes the case in which absolutely no light enters the solar cell from the "back surface" side. In addition, the "front surface" of a solar cell module indicates a surface through which light that has entered from the "front surface" of the solar cell is allowed to pass, and the "back surface" of the solar cell module indicates a surface opposite to the light receiving surface of the solar cell module. In addition, a statement such as "providing a second component above/below a first component" is not intended to merely indicate the case in which the first and the second components are provided in contact with each other, unless a limitation is particularly imposed on the statement. That is, the statement includes the case in which there is another component present between the first and the second components. In addition, the expression "substantially XXX" is intended to include that which is considered to be practically XXX. Taking "substantially the same" as an example, the expression is intended to include, not only that which is perfectly the same, but also that which is considered to be practically the same.

Embodiment 1

[1.1 Configuration of Solar Cell According to Embodiment 1]

Figure 1:
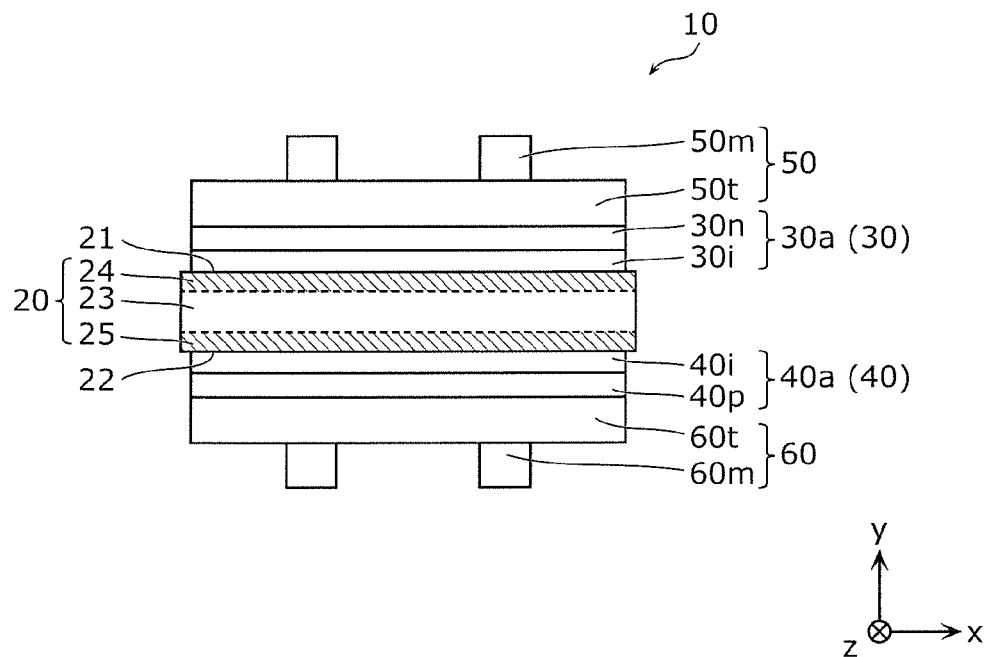
FIG. 1 is a cross sectional view illustrating a structure of a solar cell according to Embodiment 1.
Figure 2:
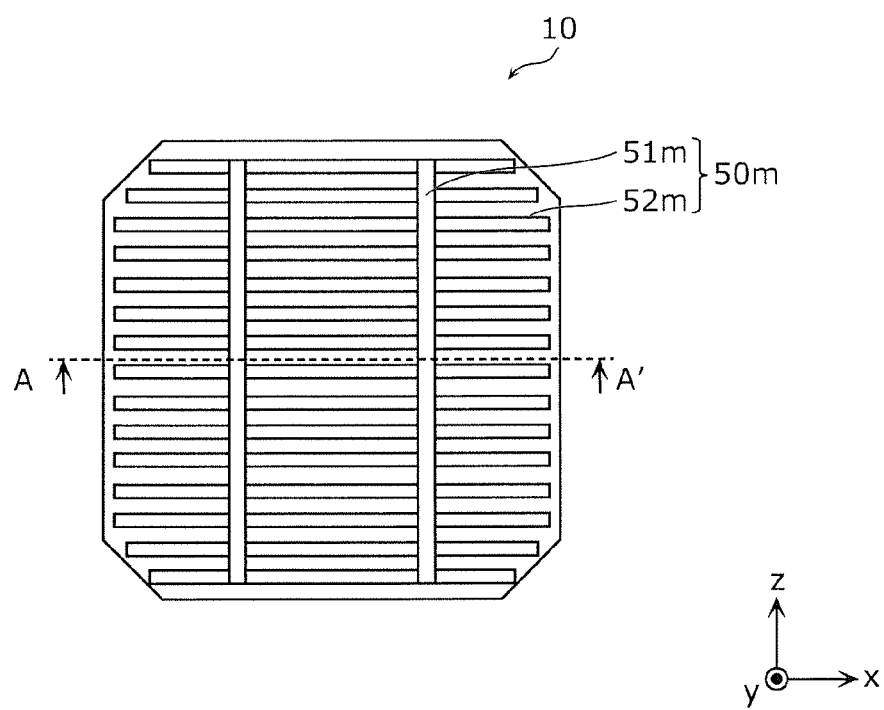
FIG. 2 is a plan view illustrating a structure of a light receiving surface side of the solar cell according to Embodiment 1.
Figure 3:
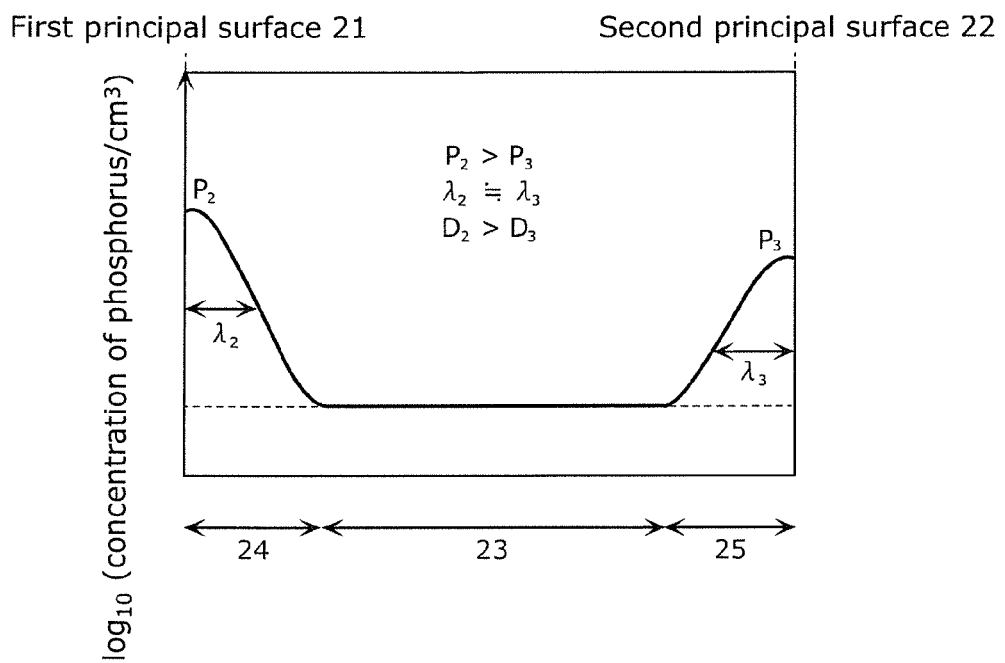
FIG. 3 is a diagram illustrating a concentration profile of an impurity in a semiconductor substrate according to Embodiment 1.

A schematic configuration of solar cell 10 according to Embodiment 1 will be described with reference to FIG. 1 through FIG. 3. FIG. 1 is a cross sectional view illustrating a structure of solar cell 10 according to Embodiment 1. FIG. 2 is a plan view illustrating a structure of a light receiving surface side of solar cell 10 according to Embodiment 1. FIG. 3 is a diagram illustrating a concentration profile of an impurity in semiconductor substrate 20 according to Embodiment 1. FIG. 1 is a cross sectional view of solar cell 10 taken along the line A-A' in FIG. 2.

Solar cell 10 has a light receiving surface and a back surface which are disposed back to back to each other. The light receiving surface of solar cell 10 indicates the surface through which sunlight mainly enters, and the back surface indicates the surface on the back side of the light receiving surface.

Solar cell 10 includes semiconductor substrate 20. Semiconductor substrate 20 has first principal surface 21 and second principal surface 22 which are disposed back to back to each other. The embodiment describes an example of a case in which first principal surface 21 is the surface on the light receiving surface side, and second surface 22 is the surface on the back surface side. Semiconductor substrate 20 generates carriers by receiving light. Here, the carriers are electrons and holes which are generated by light that semiconductor substrate 20 absorbs. Semiconductor substrate 20 has a first conductivity type of either an n type or a p type. In order to improve the efficiency of utilizing incident light, first principal surface 21 of semiconductor substrate 20 may have a texture structure which includes a plurality of bumpy portions. Second principal surface 22 of semiconductor substrate 20 may also have a texture structure which includes the plurality of bumpy portions, or may have a flat surface without the texture structure. The height of the texture structure is, for example, 1 μm to 20 μm, and preferably 2 μm to 8 μm.

As semiconductor substrate 20, a crystalline silicon substrate, such as a monocrystalline silicon substrate or a polycrystalline silicon substrate, can be used. In addition, a substrate other than the crystalline silicon substrate can also be used as semiconductor substrate 20. For example, it is possible to use a typical semiconductor substrate, such as a germanium (Ge) semiconductor substrate, a IV-IV compound semiconductor substrate typified by silicon carbide (SiC) and silicon germanium (SiGe), and a III-V compound semiconductor substrate typified by gallium arsenide (GaAs), gallium nitride (GaN), and indium phosphide (InP).

The embodiment describes an example of a case in which (i) a monocrystalline silicon substrate is used as semiconductor substrate 20, (ii) a first conductivity type is an n type, and (iii) a second conductivity type which is different from the first conductivity type is a p type. The thickness of semiconductor substrate 20 is, for example, 30 μm to 300 μm, and preferably 50 μm to 150 μm. In addition, semiconductor substrate 20 includes, as the impurity of the first conductivity type, a dopant, such as phosphorus (P), arsenic (As), or antimony (Sb).

The texture structure of semiconductor substrate 20 is a bumpy structure in which quadrangular pyramids each having a sloping face corresponding to a specific plane orientation of semiconductor substrate 20 are two-dimensionally arrayed. The texture structure provided on each of first principal surface 21 and second principal surface 22 of semiconductor substrate 20 complexly reflects and diffracts light which enters solar cell 10, thereby improving the efficiency of utilizing the light which enters solar cell 10.

Solar cell 10 includes, above first principal surface 21 of semiconductor substrate 20, first semiconductor layer 30 of the first conductivity type which is a conductivity type identical to that of semiconductor substrate 20. In addition, solar cell 10 includes, below second principal surface 22 of semiconductor substrate 20, second semiconductor layer 40 of a second conductivity type which is a conductivity type different from that of semiconductor substrate 20. Due to a surface electric-field effect, first semiconductor layer 30 can reduce carrier recombination at and in the vicinity of first principal surface 21 of semiconductor substrate 20. Second semiconductor layer 40 forms a p-n junction with semiconductor substrate 20, and thus second semiconductor layer 40 is capable of producing electromotive force due to carrier separation.

Semiconductor substrate 20 includes first impurity region 23 of the first conductivity type. The concentration of an impurity of the first conductivity type in first impurity region 23 is, for example, $5 \times 10^{13}$ cm$^{-3}$ to $1 \times 10^{17}$ cm$^{-3}$, and preferably approximately $5 \times 10^{14}$ cm$^{-3}$ to $2 \times 10^{16}$ cm$^{-3}$.

In addition, semiconductor substrate 20 includes second impurity region 24 of the first conductivity type between first impurity region 23 and first semiconductor layer 30. The thickness of second impurity region 24 is, for example, 1 nm to 1 μm, preferably 10 nm to 100 nm, and more preferably 20 nm to 80 nm. The concentration of an impurity of the first conductivity type in second impurity region 24 is, for example, $1\times10^{17}$ cm$^{-3}$ to $1\times10^{20}$ cm$^{-3}$, and preferably $5\times10^{17}$ cm$^{-3}$ to $1\times10^{19}$ cm$^{-3}$.

Furthermore, semiconductor substrate 20 includes third impurity region 25 of the first conductivity type between first impurity region 23 and second semiconductor layer 40. The thickness of third impurity region 25 is, for example, 1 nm to 1 μm, preferably 10 nm to 100 nm, and more preferably 20 nm to 80 nm. The concentration of an impurity of the first conductivity type in third impurity region 25 is, for example, $1\times10^{17}$ cm$^{-3}$ to $1\times10^{20}$ cm$^{-3}$, and preferably $5\times10^{17}$ cm$^{-3}$ to $1\times10^{19}$ cm$^{-3}$.

Here, the concentration of the impurity of the first conductivity type in second impurity region 24 and the concentration of the impurity of the first conductivity type in third impurity region 25 are higher than the concentration of the impurity of the first conductivity type in first impurity region 23. The concentration of the impurity of the first conductivity type in second impurity region 24 is higher than the concentration of the impurity of the first conductivity type in third impurity region 25.

It is known that first semiconductor layer 30 of the first conductivity type above first principal surface 21 of semiconductor substrate 20 of the first conductivity type is capable of reducing carrier recombination at and in the vicinity of the joining interface between semiconductor substrate 20 and first semiconductor layer 30 due to the surface electric-field effect. However, carrier recombination cannot be completely prevented even with this method, and thus there is a demand for further reduction in carrier recombination. An embodiment of the present invention can improve power generation characteristics by providing second impurity region 24 on the first-principal-surface-21 side of semiconductor substrate 20 to increase a surface electric-field effect, and to further reduce carrier recombination at and in the vicinity of the joining interface between semiconductor substrate 20 and first semiconductor layer 30.

Meanwhile, the second-principal-surface-22 side of semiconductor substrate 20 has a problem that an impurity of the second conductivity type, such as boron (B), which is being added during manufacturing processes, etc. causes conductivity in the vicinity of second principal surface 22 of semiconductor substrate 20 to decrease. That is to say, the addition of, for example, boron (B) which is an impurity of the second conductivity type to, for example, phosphorus (P) which is an impurity of the first conductivity type that has been originally being added considerably increases resistance in the vicinity of second principal surface 22 of semiconductor substrate 20, thereby deteriorating the power generation characteristics. Besides an impurity of the second conductivity type, there are other impurities, such as hydrogen, oxygen, nitrogen, fluorine, etc. which are being added during manufacturing processes etc. and cause the power generation characteristics to deteriorate. An embodiment of the present invention can improve the power generation characteristics by providing third impurity region 25 on the second-principal-surface-22 side of semiconductor substrate 20 to prevent such a decrease in conductivity in the vicinity of second principal surface 22 of semiconductor substrate 20.

The effect of reducing carrier recombination by providing first semiconductor layer 30 of the first conductivity type above first principal surface 21 of semiconductor substrate 20 of the first conductivity type, and the effect of preventing a decrease in conductivity in the vicinity of second principal surface 22 by providing third impurity region 25 on the second-principal-surface-22 side of semiconductor substrate 20 of the first conductivity type are individually effective. However, by providing a suitable impurity region on each of the first-principal-surface-21 side and the second-principal-surface-22 side, it is possible to obtain a combined effect that enables the improvement in the conductivity on the second-principal-surface-22 side without limiting the rate of the effect of reducing surface recombination on the first-principal-surface-21 side. This combined effect enables the power generation characteristics to improve far more than the improvement produced by the sum of the effects that the first-principal-surface-21 side and the second-principal-surface-22 side individually produce.

In an embodiment of the present invention, the impurity of the first conductivity type in second impurity region 24 on the first-principal-surface-21 side of semiconductor substrate 20 of the first conductivity type and the impurity of the first conductivity type in third impurity region 25 on the second-principal-surface-22 side of semiconductor substrate 20 of the first conductivity type do not have the same concentration profile, but have characteristically different concentration profiles to suitably improve the power generation characteristics.

The embodiment describes an example of semiconductor substrate 20 which has concentration profiles of an impurity of the first conductivity type as illustrated in FIG. 3. The concentration profiles of the impurity of the first conductivity type in semiconductor substrate 20 include, in the following stated order, second impurity region 24, first impurity region 23, and third impurity region 25 from the first-principal-surface-21 side of semiconductor substrate 20 to the second-principal-surface-22 side of semiconductor substrate 20 along the thickness direction (the direction perpendicular to first principal surface 21 and second principal surface 22) of semiconductor substrate 20.

The concentration of the impurity of the first conductivity type in first impurity region 23 is, for example, $5\times10^{13}$ cm$^{-3}$ to $1\times10^{17}$ cm$^{-3}$, and preferably $5\times10^{14}$ cm$^{-3}$ to $2\times10^{16}$ cm$^{-3}$.

Diffusion width $\lambda_2$ of second impurity region 24 is, for example, 10 nm to 100 nm, and preferably 20 nm to 80 nm. Peak concentration $P_2$ of second impurity region 24 is, for example, $2\times10^{18}$ cm$^{-3}$ to $4\times10^{19}$ cm$^{-3}$, and preferably $3\times10^{18}$ cm$^{-3}$ to $3\times10^{19}$ cm$^{-3}$. Dose $D_2$ in second impurity region 24 is, for example, $1\times10^{13}$ cm$^{-2}$ to $2\times10^{14}$ cm$^{-2}$, and preferably $3\times10^{13}$ cm$^{-2}$ to $1\times10^{14}$ cm$^{-2}$.

Diffusion width $\lambda_3$ of third impurity region 25 is, for example, 10 nm to 100 nm, and preferably 20 nm to 80 nm. Peak concentration $P_3$ of third impurity region 25 is, for example, $1\times10^{18}$ cm$^{-3}$ to $2\times10^{19}$ cm$^{-3}$, and preferably $2\times10^{18}$ cm$^{-3}$ to $1.5\times10^{19}$ cm$^{-3}$. Dose $D_3$ in third impurity region 25 is, for example, $5\times10^{12}$ cm$^{-2}$ to $1\times10^{14}$ cm$^{-2}$, and preferably $1\times10^{13}$ cm$^{-2}$ to $5\times10^{13}$ cm$^{-2}$.

In the embodiment, peak concentration $P_2$ of second impurity region 24 is higher than peak concentration $P_3$ of third impurity region 25. Dose $D_2$ in second impurity region 24 is higher than dose $D_3$ in third impurity region 25. In addition, peak concentration $P_2$ of second impurity region 24 is preferably, for example, at least twice as high as peak concentration $P_3$ of third impurity region 25. Dose $D_2$ in second impurity region 24 is preferably higher than dose $D_3$ in third impurity region 25 by, for example, at least 10 times. Furthermore, diffusion width $\lambda_2$ of second impurity region 24 and diffusion width $\lambda_3$ of third impurity region 25 may be substantially the same.

Here, diffusion width $\lambda_2$ of second impurity region 24 is a distance along the thickness direction of semiconductor substrate 20 from first principal surface 21 of semiconductor substrate 20 up to a point where the concentration of the impurity of the first conductivity type in second impurity region 24 falls by half of peak concentration $P_2$ of second impurity region 24. In addition, when peak concentration $P_2$ is present inwardly of first principal surface 21 and in semiconductor substrate 20, diffusion width $\lambda_2$ of second impurity region 24 is a distance along the thickness direction of semiconductor substrate 20 from first principal surface 21 of semiconductor substrate 20 up to a point where the concentration of the impurity of the first conductivity type in second impurity region 24 falls by half of peak concentration $P_2$ of second impurity region 24 through the position of peak concentration $P_2$ of the first conductivity type in second impurity region 24.

Diffusion width $\lambda_3$ of third impurity region 25 is a distance along the thickness direction of semiconductor substrate 20 from second principal surface 22 of semiconductor substrate 20 up to a point where the concentration of the impurity of the first conductivity type in third impurity region 25 falls by half of peak concentration $P_3$ of third impurity region 25. In addition, when peak concentration $P_3$ is present inwardly of second principal surface 22 and in semiconductor substrate 20, diffusion width $\lambda_3$ of third impurity region 25 is a distance along the thickness direction of semiconductor substrate 20 from second principal surface 22 of semiconductor substrate 20 up to a point where the concentration of the impurity of the first conductivity type in third impurity region 25 falls by half of peak concentration $P_3$ of third impurity region 25 through the position of peak concentration $P_3$ of the first conductivity type in third impurity region 25.

Dose $D_2$ in second impurity region 24 is the total amount of the impurity of the first conductivity type per unit area in a distance from first principal surface 21 to diffusion width $\lambda_2$ of second impurity region 24 along the thickness direction of semiconductor substrate 20 when first principal surface 21 is seen in a plan view. Dose $D_3$ in third impurity region 25 is the total amount of the impurity of the first conductivity type per unit area in a distance from second principal surface 22 to diffusion width $\lambda_3$ of third impurity region 25 along the thickness direction of semiconductor substrate 20 when second principal surface 22 is seen in a plan view.

As illustrated in FIG. 1, first semiconductor layer 30 of the first conductivity type, which is a conductivity type identical to that of semiconductor substrate 20, is provided above the entirety of, or above substantially the entirety of first principal surface 21 of semiconductor substrate 20 in the embodiment. First semiconductor layer 30 has a function of reducing carrier recombination at and in the vicinity of the joining interface between first semiconductor layer 30 and semiconductor substrate 20. As first semiconductor layer 30, amorphous silicon layer 30a is used in the embodiment. In addition, amorphous silicon layer 30a has a stacked structure in which intrinsic amorphous silicon layer 30i and first conductivity type amorphous silicon layer 30n of the first conductivity type are stacked from first principal surface 21 of semiconductor substrate 20 in the stated order. Intrinsic amorphous silicon layer 30i is provided above first principal surface of semiconductor substrate 20. First conductivity type amorphous silicon layer 30n is provided above intrinsic amorphous silicon layer 30i. Semiconductor substrate 20 and first semiconductor layer 30 forms a heterojunction in the embodiment.

Note that when "substantially" can be expressed in a numerical value in the present specification, "substantially" means that it is within the range of a difference of ±10% to an object compared.

An "intrinsic semiconductor" in the present specification is not limited to a semiconductor completely intrinsic that does not include any impurity of a conductivity type, but includes a semiconductor from which the inclusion of an impurity of a conductivity type is intentionally prevented, and a semiconductor which includes an impurity of a conductivity type that is being mixed during manufacturing processes, etc. In addition, when a small amount of an impurity of a conductivity type is intentionally or unintentionally added, the intrinsic semiconductor includes a semiconductor which is formed such that the concentration of the impurity of the conductivity type in the semiconductor is at most $5\times10^{18}$ cm$^{-3}$, for example. Furthermore, an "amorphous layer" in the present specification may include both an amorphous portion and a crystalline portion.

First conductivity type amorphous silicon layer 30n contains an impurity of the first conductivity type which is identical to the impurity that semiconductor substrate 20 contains. As the impurity of the first conductivity type, a dopant, such as phosphorus (P), arsenic (As), or antimony (Sb), is added to first conductivity type amorphous silicon layer 30n. The concentration of the impurity of the first conductivity type in first conductivity type amorphous silicon layer 30n is, for example, at least $5\times10^{19}$ cm$^{-3}$, and preferably at least $5\times10^{20}$ cm$^{-3}$ and at most $5\times10^{21}$ cm$^{-3}$.

First semiconductor layer 30 may be thick to an extent that carrier recombination at first principal surface 21 of semiconductor substrate 20 can be sufficiently reduced. Meanwhile, first semiconductor layer 30 may be thin to an extent that the amount of incident light which first semiconductor layer 30 absorbs can be reduced as much as possible. The thickness of first semiconductor layer 30 is, for example, 2 nm to 75 nm. More specifically, the thickness of intrinsic amorphous silicon layer 30i is, for example, 1 nm to 25 nm, and preferably 2 nm to 5 nm. In addition, the thickness of first conductivity type amorphous silicon layer 30n is, for example, 1 nm to 50 nm, and preferably 2 nm to 10 nm.

As illustrated in FIG. 1, second semiconductor layer 40 of the second conductivity type which is a conductivity type different from that of semiconductor substrate 20 is provided below the entirety of, or below substantially the entirety of second principal surface 22 of semiconductor substrate 20 in the embodiment. Second semiconductor layer 40 has a function of reducing carrier recombination at the joining interface between second semiconductor layer 40 and semiconductor substrate 20, and a function of separating carriers by forming a p-n junction with semiconductor substrate 20. As second semiconductor layer 40, amorphous silicon layer 40a is used in the embodiment. In addition, amorphous silicon layer 40a has a stacked structure in which intrinsic amorphous silicon layer 40i and second conductivity type amorphous silicon layer 40p of the second conductivity type are stacked from second principal surface 22 of semiconductor substrate 20 in the stated order. Intrinsic amorphous silicon layer 40i is provided below second principal surface 22 of semiconductor substrate 20. Second conductivity type amorphous silicon layer 40p is provided below intrinsic amorphous silicon layer 40i. Semiconductor substrate 20 and second semiconductor layer 40 forms a heterojunction in the embodiment.

Second conductivity type amorphous silicon layer 40p contains an impurity of the second conductivity type which is different from the impurity that semiconductor substrate 20 contains. As the second conductivity type impurity, a dopant, such as boron (B), is added to second conductivity type amorphous silicon layer 40p. The concentration of the impurity of the second conductivity type in second conductivity type amorphous silicon layer 40p is, for example, at least $1×10^{19}$ cm$^{-3}$, and preferably at least $5×10^{20}$ cm$^{-3}$ and at most $5×10^{21}$ cm$^{-3}$.

Second semiconductor layer 40 may be thick to an extent that carrier recombination at second principal surface 22 of semiconductor substrate 20 can be sufficiently reduced. The thickness of second semiconductor layer 40 is, for example, 2 nm to 75 nm. More specifically, the thickness of intrinsic amorphous silicon layer 40i is, for example, 1 nm to 25 nm, and preferably 2 nm to 5 nm. In addition, the thickness of second conductivity type amorphous silicon layer 40p is, for example, 1 nm to 50 nm, and preferably 2 nm to 10 nm.

Note that, in order to improve the effect of reducing carrier recombination, all the intrinsic amorphous silicon layers (30i and 40i), first conductivity type amorphous silicon layer 30n, and second conductivity type amorphous silicon layer 40p may contain hydrogen (H). In addition to hydrogen (H), all the intrinsic amorphous silicon layers (30i and 40i), first conductivity type amorphous silicon layer 30n, and second conductivity type amorphous silicon layer 40p may contain oxygen (O), carbon (C), or germanium (Ge). Furthermore, an oxide silicon layer may be disposed between semiconductor substrate 20 and amorphous silicon layer 30a, and between semiconductor substrate 20 and amorphous silicon layer 40a.

Note that configurations of first semiconductor layer 30 and second semiconductor layer 40 are not limited to only the configurations described above. Each of first semiconductor layer 30 and second semiconductor layer 40 may be a semiconductor layer which has a conductivity type, and includes at least one of monocrystalline silicon, polycrystalline silicon, and microcrystalline silicon. In addition, each of first semiconductor layer 30 and second semiconductor layer 40 may be a structure that includes the semiconductor layer, and an insulating layer which includes, for example, a silicon compound containing at least one of oxygen (O) and nitrogen (N) or an aluminum compound containing at least one of oxygen (O) and nitrogen (N) which is stacked in the stated order from first principal surface 21 of semiconductor substrate 20 or second principal surface 22 of semiconductor substrate 20. In the case of employing this stacked structure, the insulating layer may be thick to a degree that allows a tunnel current to flow, and is, for example, 0.5 nm to 10 nm.

As illustrated in FIG. 1, solar cell 10 includes first electrode 50 and second electrode 60. First electrode 50 and second electrode 60 are spaced apart and electrically separated from each other. First electrode 50 is provided above first semiconductor layer 30, and is electrically connected with first semiconductor layer 30. Meanwhile, second electrode 60 is provided below second semiconductor layer 40, and is electrically connected with second semiconductor layer 40. The embodiment describes an example in which first electrode 50 is an n-side electrode, and second electrode 60 is a p-side electrode. The n-side electrode collects electrons which semiconductor substrate 20 generates, and the p-side electrode collects holes which semiconductor substrate 20 generates.

First electrode 50 has a structure in which first light-transmissive conductive film 50t and first metal electrode 50m that is not light-transmissive are stacked above first semiconductor layer 30 in the stated order. First light-transmissive conductive film 50t is provided above first semiconductor layer 30. First metal electrode 50m is provided above first light-transmissive conductive film 50t. As illustrated in FIG. 2, first metal electrode 50m includes first bus bar electrode 51m and a plurality of first finger electrodes 52m. Meanwhile, second electrode 60 has a structure in which second light-transmissive conductive film 60t and second metal electrode 60m that is not light-transmissive are stacked below second semiconductor layer 40 in the stated order. Second light-transmissive conductive film 60t is provided below second semiconductor layer 40. Second metal electrode 60m is provided below second light-transmissive conductive film 60t. Second metal electrode 60m includes second bus bar electrode 61m (not illustrated) and a plurality of second finger electrodes 62m (not illustrated).

As illustrated in FIG. 1, first light-transmissive conductive film 50t is provided above the entirety of, or above substantially the entirety of first semiconductor layer 30. In addition, second light-transmissive conductive film 60t is provided below the entirety of, or below substantially the entirety of second semiconductor layer 40. Note that first electrode 50 and second electrode 60 need not include first light-transmissive conductive film 50t and second light-transmissive conductive film 60t, respectively. First metal electrode 50m and second metal electrode 60m may be directly connected with first semiconductor layer 30 and second semiconductor layer 40, respectively.

First light-transmissive conductive film 50t and second light-transmissive conductive film 60t each include at least one of metallic oxides, such as indium oxide ($In_2O_3$), zinc oxide (ZnO), tin oxide ($SnO_2$), or titanium oxide ($TiO_2$), for example. In addition, an element, such as tin (Sn), zinc (Zn), tungsten (W), antimony (Sb), titanium (Ti), cerium (Ce), or gallium (Ga) may be added to the at least one of the metallic oxides. The thickness of the light-transmissive conductive films (50t and 60t) is, for example, 30 μm to 200 μm, and preferably 40 μm to 90 μm.

As illustrated in FIG. 2, first bus bar electrode 51m is electrically connected with the plurality of first finger electrodes 52m, and is disposed to intersect with the plurality of first finger electrodes 52m. Meanwhile, second bus bar electrode 61m is electrically connected with the plurality of second finger electrodes 62m, and is disposed to intersect with the plurality of second finger electrodes 62m. Solar cell 10 includes a plurality of first bus bar electrodes 51m which is, for example, a plurality of linear electrodes, and a plurality of second bus bar electrodes 61m which is, for example, a plurality of linear electrodes. Each of the plurality of first finger electrodes 52m and the plurality of second finger electrodes 62m is a plurality of narrow linear electrodes disposed parallel with each other. Note that first metal electrode 50m need not include first bus bar electrode 51m, and second metal electrode 60m need not include second bus bar electrode 61m. The thickness of first bus bar electrode 51m, second bus bar electrode 61m, first finger electrode 52m, and second finger electrode 62m is, for example, 10 μm to 50 μm. The width of first bus bar electrode 51m and second bus bar electrode 61m is, for example, 100 μm to 2 mm, and the width of first finger electrode 52m and second finger electrode 62m is, for example, 20 μm to 300 μm.

Each of first metal electrode 50m and second metal electrode 60m contains metal, such as silver (Ag), copper (Cu), aluminum (Al), gold (Au), nickel (Ni), tin (Sn), or chromium (Cr), or an alloy which includes at least one of the metals, for example. Each of first metal electrode 50m and second metal electrode 60m may include a single layer or multiple layers.

When solar cell 10 is seen in a plan view, the area of first metal electrode 50m may be smaller than the area of second metal electrode 60m. In addition, the number of first finger electrodes 52m may be less than the number of second finger electrodes 62m. Furthermore, instead of second finger electrode 62m, second metal electrode 60m may include a metal film that covers the entirety of, or substantially the entirety of second semiconductor layer 40 or second light-transmissive conductive film 60t.

As has been described above, solar cell 10 according to an aspect of the present invention includes: semiconductor substrate 20 of a first conductivity type which includes first principal surface 21 and second principal surface 22; first semiconductor layer 30 of the first conductivity type disposed above first principal surface 21; and second semiconductor layer 40 of a second conductivity type disposed below second principal surface 22. Semiconductor substrate 20 includes: first impurity region 23 of the first conductivity type; second impurity region 24 of the first conductivity type disposed between first impurity region 23 and first semiconductor layer 30; and third impurity region 25 of the first conductivity type disposed between first impurity region 23 and second semiconductor layer 40. A concentration of an impurity of the first conductivity type in second impurity region 24 is higher than a concentration of an impurity of the first conductivity type in third impurity region 25, and the concentration of the impurity of the first conductivity type in third impurity region 25 is higher than a concentration of an impurity of the first conductivity type in first impurity region 23.

[1.2 Manufacturing Method of Solar Cell]

A manufacturing method of solar cell 10 according to Embodiment 1 will be described.

Firstly, a crystalline silicon substrate of the first conductivity type is prepared as semiconductor substrate 20 in the embodiment. The concentration of an impurity of the first conductivity type in semiconductor substrate 20 is, for example, $5 \times 10^{13}$ $cm^{-3}$ to $1 \times 10^{17}$ $cm^{-3}$, and preferably $5 \times 10^{14}$ $cm^{-3}$ to $2 \times 10^{16}$ $cm^{-3}$. In addition, a first principal surface and a second principal surface of the crystalline silicon substrate are (100) planes.

Next, semiconductor substrate 20 is anisotropically etched. With this, a bumpy structure in which quadrangular pyramids each of which having (111) planes as slopes are two-dimensionally arrayed is formed on first principal surface 21 of semiconductor substrate 20 and on second principal surface 22 of semiconductor substrate 20.

Specifically, semiconductor substrate 20 is immersed in an anisotropic etching solution to begin with. The anisotropic etching solution is, for example, an alkaline aqueous solution which includes at least one of sodium hydroxide (NaOH), potassium hydroxide (KOH), and tetramethylammonium hydroxide (TMAH). Next, semiconductor substrate 20 is immersed in a predetermined etching solution. With this, peaks and troughs of the texture structure are shaped into round shapes. The predetermined etching solution is, for example, a mixed solution of hydrofluoric acid (HF) and nitric acid ($HNO_3$), or a mixed solution of hydrofluoric acid (HF), nitric acid ($HNO_3$), and acetic acid ($CH_3COOH$). The peaks and the troughs of the texture structure which are shaped into rounded shapes can prevent solar cell 10 from cracking due to contact.

Next, second impurity region 24 is formed on the first-principal-surface-21 side of semiconductor substrate 20, and third impurity region 25 is formed on the second-principal-surface-22 side of semiconductor substrate 20. As an impurity of the first conductivity type in second impurity region 24 and third impurity region 25, phosphorus (P), arsenic (As), antimony (Sb), etc. can be used. Second impurity region 24 and third impurity region 25 can be formed by employing, for example, a thermal diffusion method, a plasma doping method, an epitaxial growth method, an ion implantation method, etc.

When the thermal diffusion method is employed as a method for forming second impurity region 24 and third impurity region 25, the use of, particularly, phosphorus oxychloride ($POCl_3$) gas enables phosphorus (P), which is an impurity of the first conductivity type, to be suitably added to the first-principal-surface-21 side of semiconductor substrate 20 and the second-principal-surface-22 side of semiconductor substrate 20 while preventing the generation of a defect. In addition, instead of the $POCl_3$ gas, an oxide film containing phosphorus (P) which is formed on first principal surface 21 of semiconductor substrate 20 and below second principal surface 22 of semiconductor substrate 20 using a wet process can be employed as a diffusion source of a phosphorus (P) dopant which is an impurity of the first conductivity type.

When the plasma doping method is employed as a method for forming second impurity region 24 and third impurity region 25, source gas in which phosphine ($PH_3$) is diluted with hydrogen ($H_2$) can be used. This can reduce the manufacturing cost of a manufacturing method which employs a chemical vapor deposition method, such as the plasma CVD method, for forming first semiconductor layer 30 and second semiconductor layer 40.

Compared to the thermal diffusion method, when the epitaxial growth method is employed as a method for forming second impurity region 24 and third impurity region 25, the concentration of the impurity of the first conductivity type in each of second impurity region 24 and third impurity region 25 steeply increases at the joining interface between semiconductor substrate 20 and first semiconductor layer 30 and between semiconductor substrate 20 and second semiconductor layer 40, respectively. Therefore, the concentration of the impurity of the first conductivity type in the entirety of second impurity region 24 and in the entirety of third impurity region 25 can be readily uniformized.

When the ion implantation method is employed as a method for forming second impurity region 24 and third impurity region 25, high-temperature annealing etc. are used to reduce a defect generated during the ion implantation while electrically activating implanted ions.

When the thermal diffusion method or the plasma doping method is employed as a method for forming second impurity region 24 and third impurity region 25, the thermal diffusion method and the plasma doping method form a concentration gradient in which the concentration of the impurity of the first conductivity type is highest at first principal surface 21 of semiconductor substrate 20 and at second principal surface 22 of semiconductor substrate 20, and gradually lowers as a distance from first principal surface 21 and a distance from second principal surface 22 increase.

When the ion implantation method is employed as a method for forming second impurity region 24 and third impurity region 25, it is possible to form a concentration profile identical to the concentration profile formed when the thermal diffusion method or the plasma doping method is employed. It is also possible to lower the concentration of the impurity in the outermost surfaces depending on conditions set for implantation energy and high-temperature-annealing, thereby preventing the reduction in surface recombination velocity caused by a highly concentrated impurity.

The embodiment employs the thermal diffusion method which uses $POCl_3$ gas. A barrier film is formed only on second principal surface 22 of semiconductor substrate 20 before phosphorus (P) is diffused on the first-principal-surface-21 side of semiconductor substrate 20 and the second-principal-surface-22 side of semiconductor surface 20. The barrier film provided on second principal surface 22 reduces the diffusion of phosphorus (P) on the second-principal-surface-22 side of semiconductor substrate 20 in comparison with the first-principal-surface-21 side of semiconductor substrate 20. Consequently, it is possible to obtain semiconductor substrate 20 having concentration profiles of the impurity as illustrated in FIG. 3. Note that semiconductor substrate 20 may be immersed in acid cleaning fluid after thermal diffusion is employed to remove the barrier film and to clean the surface of semiconductor substrate 20.

A silicon oxide film, a silicon nitride film, a silicon carbide film, or an amorphous silicon film can be used as the barrier film, for example. In addition, after an impurity film having an impurity of the first conductivity type is formed on the barrier film, the impurity of the first conductivity type in the impurity film may be thermally diffused into semiconductor substrate 20 via the barrier film.

Next, amorphous silicon layer 30 is formed above first principal surface 21 of semiconductor substrate 20, and amorphous silicon layer 40 is formed below second principal surface 22 of semiconductor substrate 20. The amorphous silicon layers (30 and 40) can be formed using, for example, a chemical vapor deposition (CVD) method, such as a plasma CVD method. Intrinsic amorphous silicon layer 30$i$ can be formed using source gas in which silane ($SiH_4$) is diluted with hydrogen ($H_2$). First conductivity type amorphous silicon layer 30$n$ can be formed using source gas in which phosphine ($PH_3$) is added to silane ($SiH_4$) and then diluted with hydrogen ($H_2$). Second conductivity type amorphous silicon layer 40$p$ can be formed using source gas in which diborane ($B_2H_6$) is added to silane ($SiH_4$) and then diluted with hydrogen ($H_2$).

Next, light-transmissive conductive film 50$t$ is formed above first semiconductor layer 30, and light-transmissive conductive film 60$t$ is formed below second semiconductor layer 40. The light-transmissive conductive films (50$t$ and 60$t$) can be formed using, for example, a sputtering method, a vacuum evaporation method, a CVD method, etc.

Next, first metal electrode 50$m$ is formed above light-transmissive conductive film 50$t$, and second metal electrode 60$m$ is formed below light-transmissive conductive film 60$t$. First metal electrode 50$m$ and second metal electrode 60$m$ can be formed by employing, for example, a screen printing method that uses a conductive paste, such as an Ag paste, etc. First metal electrode 50$m$ and second metal electrode 60$m$ are formed by drying or sintering the conductive paste after the conductive paste is arranged using the screen printing method. In addition, first metal electrode 50$m$ and second metal electrode 60$m$ can be formed by employing an electrolytic plating method, a vacuum evaporation method, etc.

The manufacturing method of a solar cell according to an aspect of the present invention includes: (i) a process of preparing semiconductor substrate 20; (ii) a process of forming a barrier film on a principal surface of semiconductor substrate 20; (iii) a process of forming an impurity film having an impurity of the first conductivity type on the barrier film; and (iv) a process of thermally diffusing the impurity of the first conductivity type to semiconductor substrate 20 from the impurity film via the barrier film.

Note that the manufacturing method of the solar cell according to the embodiment of the present invention is not only applicable to solar cell 10 according to Embodiment 1, but also generally applicable to a solar cell which includes an impurity region of the first conductivity type on a principal surface side of a semiconductor substrate.

In addition, when an impurity region of the first conductivity type is formed on a principal surface side of a semiconductor substrate, the manufacturing method of the solar cell according to the embodiment of the present invention is effective in keeping the concentration of an impurity of the first conductivity type in the impurity region low. For example, it is effective in the case of forming an impurity region of the first conductivity type having the concentration of an impurity of at most $1\times10^{18}$ $cm^{-3}$ when a monocrystalline silicon substrate is used as the semiconductor substrate.

Embodiment 2

[2.1 Configuration of Solar Cell According to Embodiment 2]

Figure 4:
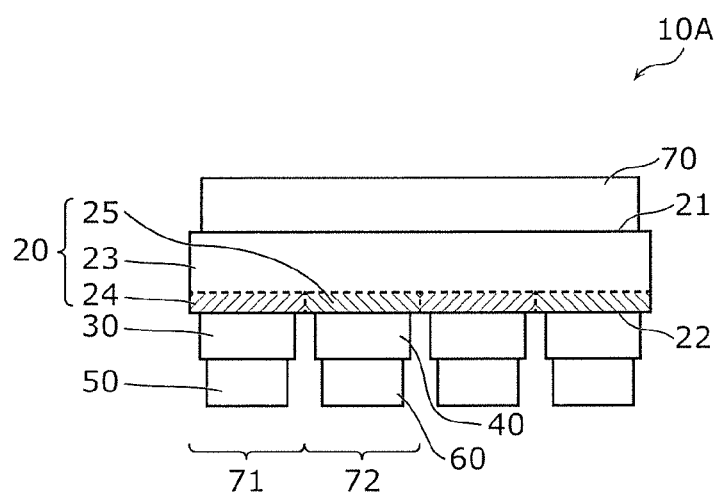
FIG. 4 is a cross sectional view illustrating a structure of a solar cell according to Embodiment 2.

FIG. 4 is a cross sectional view illustrating solar cell 10A according to Embodiment 2. Hereinafter, structural elements identical to the structural elements in Embodiment 1 use the same reference signs used for the structural elements in Embodiment 1, and redundant descriptions will be omitted. As illustrated in FIG. 4, solar cell 10A according to the embodiment is different from solar cell 10 according to Embodiment 1 in that solar cell 10A includes first electrode 50 and second electrode 60 only on the second-principal-surface-22 side of semiconductor substrate 20, while solar cell 10 according to Embodiment 1 includes first electrode 50 above first principal surface 21 of semiconductor substrate 20 and second electrode 60 below second principal surface 22 of semiconductor substrate 20.

Solar cell 10A includes semiconductor substrate 20 of a first conductivity type. Solar cell 10A includes protective layer 70 above first principal surface 21 of semiconductor substrate 20. Protective layer 70 includes, as a principal component, an insulating material, such as silicon oxide, silicon nitride, and silicon oxynitride.

Solar cell 10A includes first semiconductor layer 30 of the first conductivity type in first region 71 below second principal surface 22 of semiconductor substrate 20. In addition, solar cell 10A includes second semiconductor layer 40 of a second conductivity type in second region 72 which is different from first region 71 below second principal surface 22 of semiconductor substrate 20.

Semiconductor substrate 20 includes first impurity region 23 of the first conductivity type. In addition, semiconductor substrate 20 includes second impurity region 24 of the first conductivity type between first impurity region 23 and first semiconductor layer 30. Furthermore, semiconductor substrate 20 includes third impurity region 25 of the first conductivity type between first impurity region 23 and second semiconductor layer 40. The concentration of an impurity of the first conductivity type in each of second impurity region 24 and third impurity region 25 is higher than the concentration of an impurity of the first conductivity type in first impurity region 23. The concentration of the impurity of the first conductivity type in second impurity region 24 is higher than the concentration of the impurity of the first conductivity type in third impurity region 25.

Solar cell 10A includes first electrode 50 below first semiconductor layer 30, and second electrode 60 below second semiconductor layer 40.

As has been described above, solar cell 10A according to an aspect of the present invention includes: semiconductor substrate 20 of a first conductivity type which includes a light receiving surface and a back surface; first semiconductor layer 30 of the first conductivity type disposed in first region 71 below the back surface; and second semiconductor layer 40 of a second conductivity type disposed in second region 72 below the back surface. Semiconductor substrate 20 includes: first impurity region 23 of the first conductivity type; second impurity region 24 of the first conductivity type disposed between first impurity region 23 and first semiconductor layer 30; and third impurity region 25 of the first conductivity type disposed between first impurity region 23 and second semiconductor layer 40. A concentration of an impurity of the first conductivity type in second impurity region 24 is higher than a concentration of an impurity of the first conductivity type in third impurity region 25, and the concentration of the impurity of the first conductivity type in third impurity region 25 is higher than a concentration of an impurity of the first conductivity type in first impurity region 23.

Variation 1

[3.1 Configuration of Solar Cell According to Variation 1]

Figure 5:
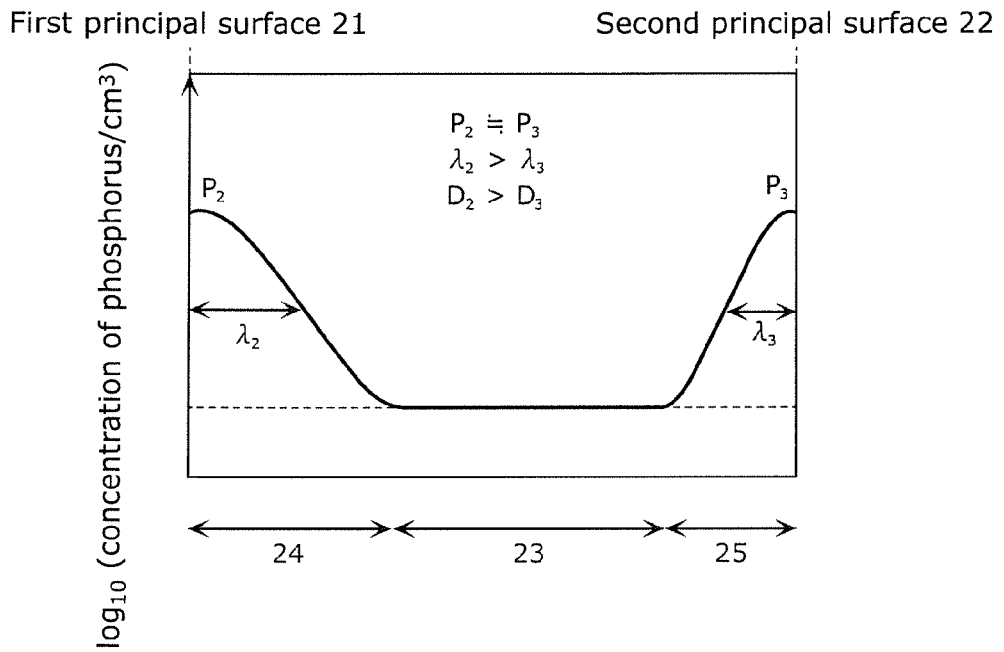
FIG. 5 is a diagram illustrating a concentration profile of an impurity in a semiconductor substrate according to Variation 1.

Variation 1 describes an example of semiconductor substrate 20 in a solar cell that has a stacked structure identical to that of solar cell 10 according to Embodiment 1. Semiconductor substrate 20 has concentration profiles of an impurity of the first conductivity type as illustrated in FIG. 5. The concentration profiles of the impurity of the first conductivity type in semiconductor substrate 20 include second impurity region 24, first impurity region 23, and third impurity region 25 in the stated order from the first-principal-surface-21 side of semiconductor substrate 20 to second-principal-surface-22 side of semiconductor substrate 20 along the thickness direction of semiconductor substrate 20. The concentration of the impurity of the first conductivity type in first impurity region 23 is, for example, $5 \times 10^{13}$ cm$^{-3}$ to $1 \times 10^{17}$ cm$^{-3}$, and preferably $5 \times 10^{14}$ cm$^{-3}$ to $2 \times 10^{16}$ cm$^{-3}$.

Diffusion width $\lambda_2$ of second impurity region 24 is, for example, 30 nm to 110 nm, and preferably 40 nm to 90 nm. Peak concentration $P_2$ of second impurity region 24 is, for example, $2 \times 10^{18}$ cm$^{-3}$ to $4 \times 10^{19}$ cm$^{-3}$, and preferably $3 \times 10^{18}$ cm$^{-3}$ to $3 \times 10^{19}$ cm$^{-3}$. Dose $D_2$ in second impurity region 24 is, for example, $1 \times 10^{13}$ cm$^{-2}$ to $2 \times 10^{14}$ cm$^{-2}$, and preferably $3 \times 10^{13}$ cm$^{-2}$ to $1 \times 10^{14}$ cm$^{-2}$.

Diffusion width $\lambda_3$ of third impurity region 25 is, for example, 20 nm to 100 nm, and preferably 20 nm to 80 nm. Peak concentration $P_3$ of third impurity region 25 is, for example, $1 \times 10^{18}$ cm$^{-3}$ to $2 \times 10^{19}$ cm$^{-3}$, and preferably $2 \times 10^{18}$ cm$^{-3}$ to $1.5 \times 10^{19}$ cm$^{-3}$. Dose $D_3$ in third impurity region 25 is, for example, $5 \times 10^{12}$ cm$^{-2}$ to $1 \times 10^{14}$ cm$^{-2}$, and preferably $1 \times 10^{13}$ cm$^{-2}$ to $5 \times 10^{13}$ cm$^{-2}$.

Here, diffusion width $\lambda_2$ of second impurity region 24 is greater than diffusion width $\lambda_3$ of third impurity region 25. Dose $D_2$ in second impurity region 24 is higher than dose $D_3$ in third impurity region 25. In addition, peak concentration $P_2$ of second impurity region 24 and peak concentration $P_3$ of third impurity region 25 may be substantially the same.

[3.2 Manufacturing Method of Solar Cell According to Variation 1]

Variation 1 uses the thermal diffusion method in which the amount of heat applied to first principal surface 21 of semiconductor substrate 20 and second principal surface 22 of semiconductor substrate 20 is changed for enabling impurity regions to have different diffusion widths.

Variation 2

[4.1 Configuration of Solar Cell According to Variation 2]

Figure 6:
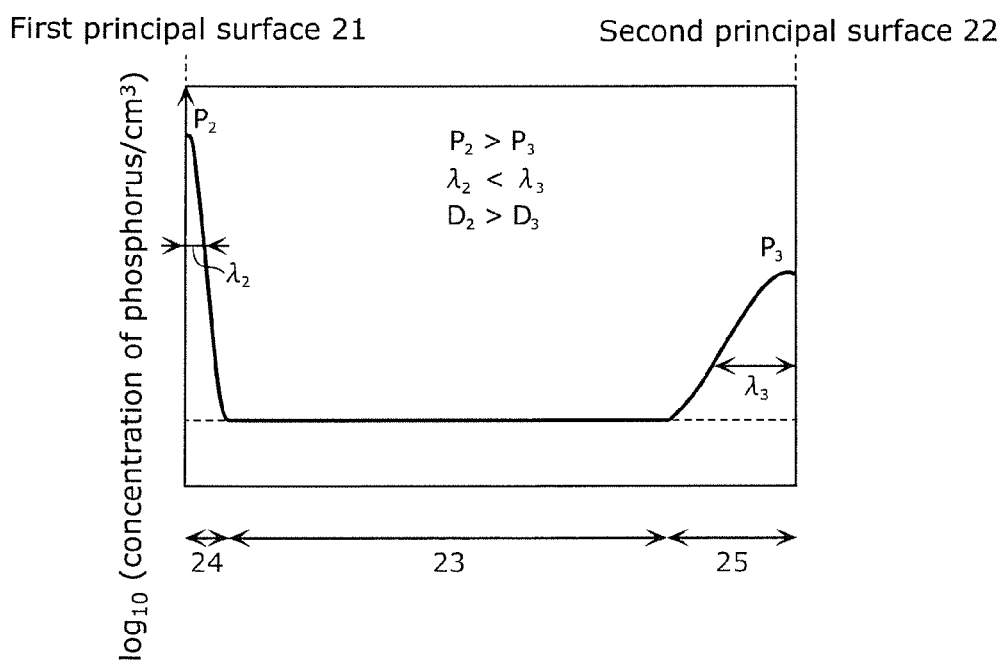
FIG. 6 is a diagram illustrating a concentration profile of an impurity in a semiconductor substrate according to Variation 2.

Variation 2 describes an example of semiconductor substrate 20 in a solar cell that has a stacked structure identical to that of solar cell 10 according to Embodiment 1. Semiconductor substrate 20 has concentration profiles of an impurity of the first conductivity type as illustrated in FIG. 6. The concentration profiles of the impurity of the first conductivity type of semiconductor substrate 20 include second impurity region 24, first impurity region 23, and third impurity region 25 in the stated order from the first-principal-surface-21 side of semiconductor substrate 20 to second-principal-surface-22 side of semiconductor substrate 20 along the thickness direction of semiconductor substrate 20.

The concentration of the impurity of the first conductivity type in first impurity region 23 is, for example, $5 \times 10^{13}$ cm$^{-3}$ to $1 \times 10^{17}$ cm$^{-3}$, and preferably $5 \times 10^{14}$ cm$^{-3}$ to $5 \times 10^{15}$ cm$^{-3}$.

Diffusion width $\lambda_2$ of second impurity region 24 is, for example, 1 nm to 50 nm, and preferably 1 nm to 10 nm. Peak concentration $P_2$ of second impurity region 24 is, for example, $4 \times 10^{18}$ cm$^{-3}$ to $8 \times 10^{19}$ cm$^{-3}$, and preferably $5 \times 10^{18}$ cm$^{-3}$ to $6 \times 10^{19}$ cm$^{-3}$. Dose $D_2$ in second impurity region 24 is, for example, $2 \times 10^{13}$ cm$^{-2}$ to $4 \times 10^{14}$ cm$^{-2}$, and preferably $6 \times 10^{13}$ cm$^{-2}$ to $2 \times 10^{14}$ cm$^{-2}$.

Diffusion width $\lambda_3$ of third impurity region 25 is, for example, 20 nm to 100 nm, and preferably 20 nm to 80 nm. Peak concentration $P_3$ of third impurity region 25 is, for example, $1 \times 10^{18}$ cm$^{-3}$ to $2 \times 10^{19}$ cm$^{-3}$, and preferably $2 \times 10^{18}$ cm$^{-3}$ to $1.5 \times 10^{19}$ cm$^{-3}$. Dose $D_3$ in third impurity region 25 is, for example, $5 \times 10^{12}$ cm$^{-2}$ to $1 \times 10^{14}$ cm$^{-2}$, and preferably $1 \times 10^{13}$ cm$^{-2}$ to $5 \times 10^{13}$ cm$^{-2}$.

Here, diffusion width $\lambda_2$ of second impurity region 24 is smaller than diffusion width $\lambda_3$ of third impurity region 25, and peak concentration $P_2$ of second impurity region 24 is higher than peak concentration $P_3$ of third impurity region 25. Dose $D_2$ in second impurity region 24 is higher than dose $D_3$ in third impurity region 25. In addition, peak concentration $P_2$ of second impurity region 24 may be higher than peak concentration $P_3$ of third impurity region 25 by, for example, at least 10 times. Diffusion width $\lambda_2$ of second impurity region 24 may be, for example, at least half the width of diffusion width $\lambda_3$ of third impurity region 25.

[4.2 Manufacturing Method of Solar Cell According to Variation 2]

Variation 2 uses the thermal diffusion method to form the third impurity region only on the second-principal-surface-22 side of semiconductor substrate 20, and then uses the plasma doping method to form the second impurity region on the first-principal-surface-21 side of semiconductor substrate 20.

Variation 3

[5.1 Configuration of Solar Cell According to Variation 3]

Figure 7:
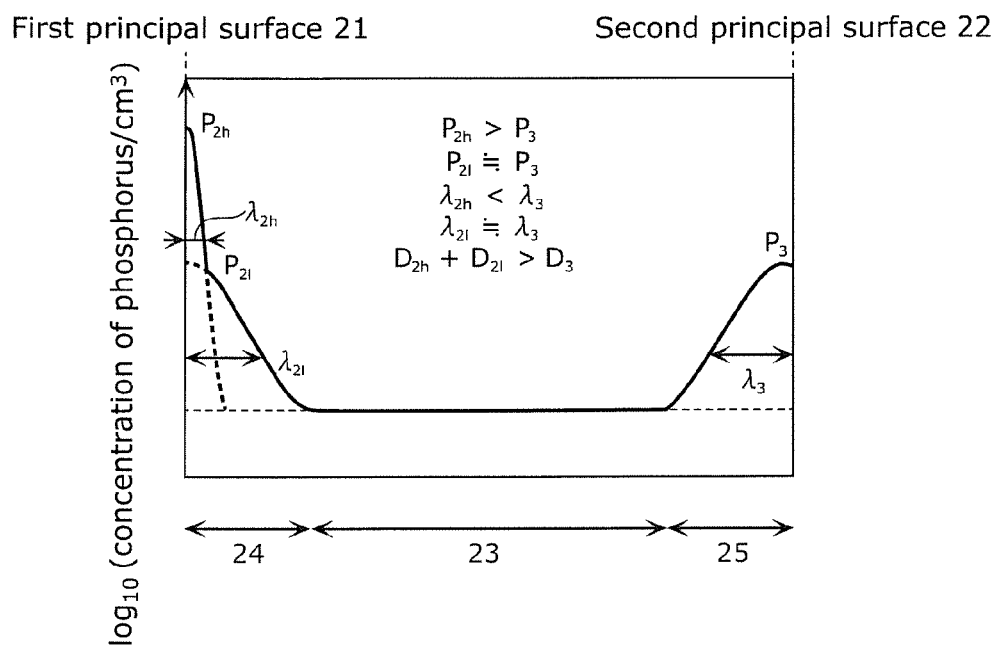
FIG. 7 is a diagram illustrating a concentration profile of an impurity in a semiconductor substrate according to Variation 3.

Variation 3 describes an example of semiconductor substrate 20 in a solar cell that has a stacked structure identical to that of solar cell 10 according to Embodiment 1. Semiconductor substrate 20 has concentration profiles of an impurity of the first conductivity type as illustrated in FIG. 7. That is to say, the concentration profiles of the impurity of the first conductivity type of semiconductor substrate 20 include second impurity region 24, first impurity region 23, and third impurity region 25 in the stated order from the first-principal-surface-21 side of semiconductor substrate 20 to second-principal-surface-22 side of semiconductor substrate 20 along the thickness direction of semiconductor substrate 20.

The concentration of the impurity of the first conductivity type in first impurity region 23 is, for example, $5 \times 10^{13}$ cm$^{-3}$ to $1 \times 10^{17}$ cm$^{-3}$, and preferably approximately $5 \times 10^{14}$ cm$^{-3}$ to $2 \times 10^{16}$ cm$^{-3}$. Second impurity region 24 has the concentration profile in which second high impurity concentration profile 24h and second low impurity concentration profile 24l are combined.

Diffusion width $\lambda_{2h}$ of second high impurity concentration profile 24h is, for example, 1 nm to 50 nm, and preferably approximately 1 nm to 10 nm. Peak concentration $P_{2h}$ of second high impurity concentration profile 24h is, for example, $4 \times 10^{18}$ cm$^{-3}$ to $8 \times 10^{19}$ cm$^{-3}$, and preferably $5 \times 10^{18}$ cm$^{-3}$ to $6 \times 10^{19}$ cm$^{-3}$. Dose $D_{2h}$ of second high impurity concentration profile 24h is, for example, $2 \times 10^{13}$ cm$^{-2}$ to $4 \times 10^{14}$ cm$^{-2}$, and preferably $6 \times 10^{13}$ cm$^{-2}$ to $2 \times 10^{14}$ cm$^{-2}$. Diffusion width $\lambda_{2l}$ of second low impurity concentration profile 24l is, for example, 10 nm to 100 nm, and preferably 20 nm to 80 nm. Peak concentration $P_{2l}$ of second low impurity concentration profile 24l is, for example, $2 \times 10^{18}$ cm$^{-3}$ to $4 \times 10^{19}$ cm$^{-3}$, and preferably $3 \times 10^{18}$ cm$^{-3}$ to $3 \times 10^{19}$ cm$^{-3}$. Dose $D_{2l}$ of second low impurity concentration profile 24l is, for example, $1 \times 10^{13}$ cm$^{-2}$ to $2 \times 10^{14}$ cm$^{-2}$, and preferably $3 \times 10^{13}$ cm$^{-2}$ to $1 \times 10^{14}$ cm$^{-2}$.

Diffusion width $\lambda_3$ of third impurity region 25 is, for example, nm to 60 nm, and preferably 20 nm to 50 nm. Peak concentration $P_3$ of third impurity region 25 is, for example, $1 \times 10^{18}$ cm$^{-3}$ to $2 \times 10^{19}$ cm$^{-3}$, and preferably $2 \times 10^{18}$ cm$^{-3}$ to $1.5 \times 10^{19}$ cm$^{-3}$. Dose $D_3$ in third impurity region 25 is, for example, $5 \times 10^{12}$ cm$^{-2}$ to $1 \times 10^{14}$ cm$^{-2}$, and preferably $1 \times 10^{13}$ cm$^{-2}$ to $5 \times 10^{13}$ cm$^{-2}$.

Here, diffusion width $\lambda_{2h}$ of second high impurity concentration profile 24h of second impurity region 24 is smaller than diffusion width $\lambda_3$ of third impurity region 25, and peak value $P_{2h}$ second high impurity concentration profile 24h is greater than peak value $P_3$ of third impurity region 25. Dose $D_2$, which is $D_{2h}$ and $D_{2l}$ combined, in second impurity region 24 is higher than dose $D_3$ in third impurity region 25.

[5.2 Manufacturing Method of Solar Cell According to Variation 3]

Variation 3 uses, to form a solar cell according to Variation 3, the thermal diffusion method to diffuse, for example, phosphorus (P), which is an impurity of the first conductivity type, on both the first-principal-surface-21 side of semiconductor substrate 20 and the second-principal-surface-22 side of semiconductor substrate 20, and then uses the plasma doping method to further diffuse, for example, phosphorus (P), which is the impurity of the first conductivity type, on the first-principal-surface-21 side of semiconductor substrate 20.

Embodiment 3

[6.1 Configuration of Solar Cell Module According to Embodiment 3]

Figure 8:
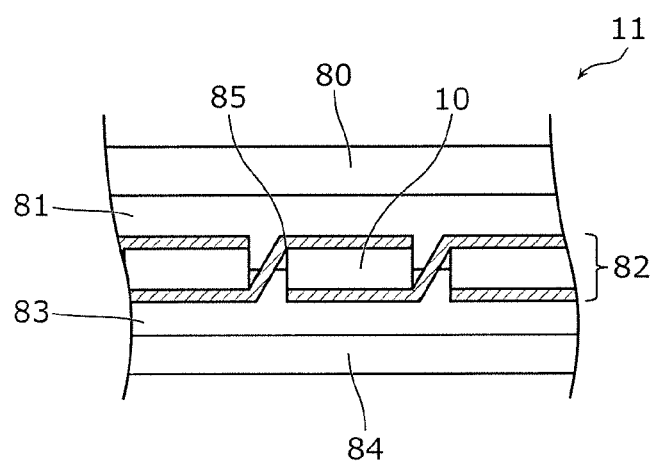
FIG. 8 is a cross sectional view illustrating a structure of a solar cell module according to Embodiment 3.
Figure 9:
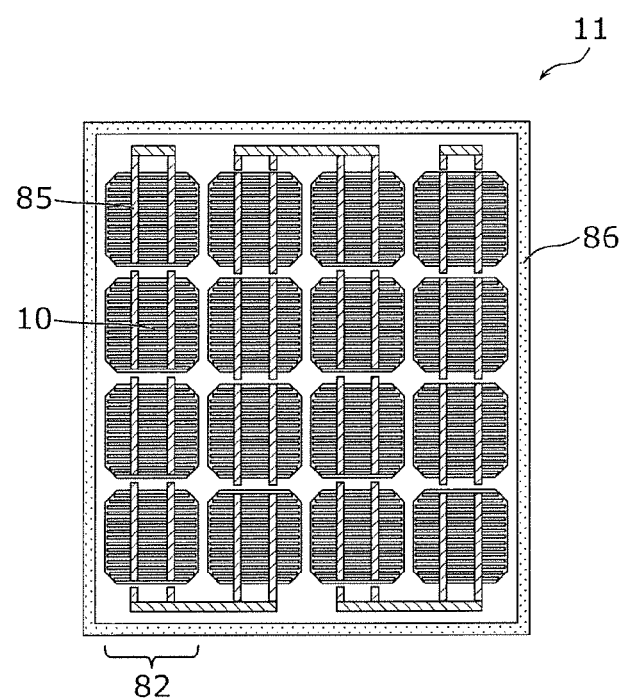
FIG. 9 is a plan view illustrating a structure of the solar cell module according to Embodiment 3 viewed from the light receiving surface side.

A schematic structure of solar cell module 11 according to Embodiment 3 will be described with reference to FIG. 8 and FIG. 9. FIG. 8 is a cross sectional view illustrating a structure of solar cell module 11 according to Embodiment 3. FIG. 9 is a plan view illustrating a structure of solar cell module 11 according to Embodiment 3 viewed from the light receiving surface side.

As illustrated in FIG. 8 and FIG. 9, solar cell module 11 has a stacked structure in which light receiving surface protection material 80, light receiving surface sealer 81, solar cell string 82, back surface sealer 83, and back surface protection material 84 are stacked in the stated order. Solar cell string 82 includes a plurality of solar cells 10 which are electrically connected in series with one another via a plurality of line members 85. Solar cell module 11 includes frame 86 that surrounds solar cell module 11.

Light receiving surface protection material 80 is, for example, glass. Back surface protection material 84 is, for example, an aluminum sheet or glass. Each of light receiving surface sealer 81 and back surface sealer 83 is, for example, an ethylene-vinyl acetate copolymer (EVA). Line member 85 includes, for example, copper. Frame 86 includes, for example, aluminum.

Variation 4

[7.1 Another Manufacturing Method of Solar Cell]

Another manufacturing method of solar cell 10 according to Embodiment 1 will be described with reference to FIG. 10.

First, semiconductor substrate 20 is prepared. As illustrated in (a) of FIG. 10, a crystalline silicon substrate of the first conductivity type is prepared as semiconductor substrate 20 in this embodiment. The crystalline silicon substrate has a texture structure (not illustrated) formed on both first principal surface 21 and second principal surface 22.

Next, storage film 26 is formed on at least one of first principal surface 21 of semiconductor substrate 20 and second principal surface 22 of semiconductor substrate 20. As storage film 26, a silicon oxide film, a silicon carbide film, an amorphous silicon film, or a silicon nitride film can be used, for example.

The embodiment describes an example in which a silicon oxide film is used as storage film 26. Storage film 26 can be formed by performing dry oxidation processing on semiconductor substrate 20 using warm air or ozone gas, or performing wet oxidation processing on semiconductor substrate 20 using a mixed solution of hydrochloric acid and hydrogen peroxide solution, a mixed solution of hydrofluoric acid and hydrogen peroxide solution, or a mixed solution of sulfuric acid and hydrogen peroxide solution. The thickness of storage film 26 is, for example, 5 nm to 500 nm, preferably 10 nm to 200 nm, and more preferably, 20 nm to 100 nm. In addition, the concentration of an impurity of the first conductivity type in storage film 26 is, for example, at most $5 \times 10^{18}$ cm$^{-3}$. The thickness of storage film 26 is 0.5 nm to 5 nm, and preferably 0.5 nm to 2 nm when storage film 26 is formed by performing chemical solution oxidation processing. The thickness of storage film 26 may be 2 nm to 500 nm, preferably 3 nm to 100 nm, and more preferably 5 nm to 50 nm when storage film 26 is formed by performing thermal oxidation processing or by using a CVD method.

Figure 10:
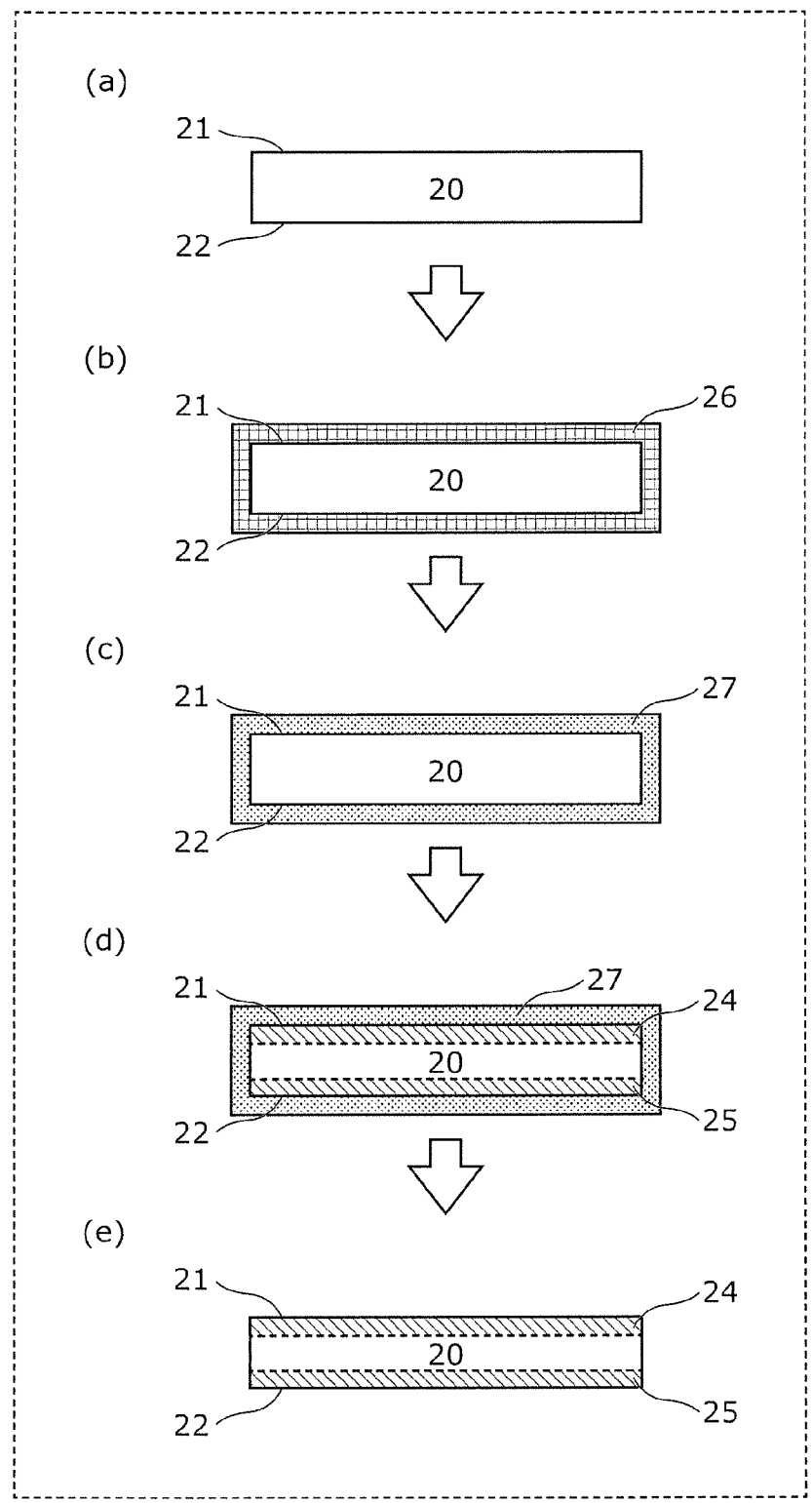
FIG. 10 is a diagram illustrating a manufacturing method of the solar cell according to Embodiments.

As illustrated in (b) of FIG. 10, the wet oxidation processing is performed on semiconductor substrate 20 using the mixed solution of hydrochloric acid and hydrogen peroxide solution to form a silicon oxide film on first principal surface 21 and second principal surface 22 of semiconductor substrate 20 in this embodiment.

Next, an impurity of the first conductivity type is caused to penetrate into storage film 26 to form storage film 27 having the impurity of the first conductivity type. Storage film 27 having the impurity of the first conductivity type can be formed using wet processing, a thermal diffusion method, a plasma doping method, an ion implantation method, etc.

In the embodiment, as illustrated in (c) of FIG. 10, the wet processing that uses phosphoric acid, or a mixed solution of phosphoric acid and nitric acid is performed on semiconductor substrate 20 on which storage film 26 is formed for causing the impurity of the first conductivity type to penetrate into storage film 26 to form storage film 27 having the impurity of the first conductivity type. The concentration of the impurity of the first conductivity type in storage film 27 is, for example, at least $5 \times 10^{18}$ cm$^{-3}$, and preferably at least $5 \times 10^{19}$ cm$^{-3}$.

Next, heat treatment is performed on semiconductor substrate 20. The heat treatment is performed, using a heat treating furnace, in temperature of at least 700° C. and at most 1100° C. for 10 to 60 minutes. The impurity of the first conductivity type is thermally diffused into first principal surface 21 of semiconductor substrate 20 and second principal surface 22 of semiconductor substrate 20 from storage film 27 having the impurity of the first conductivity type, and thus second impurity region 24 of the first conductivity type and third impurity region 25 of the first conductivity type are formed in semiconductor substrate 20 as illustrated in (d) of FIG. 10. Note that, a dopant is diffused also in a side face of a wafer connecting first principal surface 21 and second principal surface 22.

Next, storage film 27 having the impurity of the first conductivity type is removed as illustrated in (e) of FIG. 10. Storage film 27 having the impurity of the first conductivity type can be removed by performing, for example, wet processing that uses hydrofluoric acid. Accordingly, the impurity regions of the first conductivity type can be formed on the first-principal-surface-21 side of semiconductor substrate 20 and second-principal-surface-22 side of semiconductor substrate 20.

An aspect of the manufacturing method of a solar cell according to the embodiment of the present invention includes: (i) a process of preparing semiconductor substrate 20; (ii) a process of forming storage film 26 on a principal surface of semiconductor substrate 20; (iii) a process of storing an impurity of the first conductivity type in storage film 26; and (iv) a process of thermally diffusing the impurity of the first conductivity type into semiconductor substrate 20 from storage film 27.

The manufacturing method of the solar cell according to the embodiment of the present invention is not only applicable to solar cell 10 according to Embodiment 1, but also generally applicable to a solar cell which includes an impurity region of the first conductivity type on a principal surface side of a semiconductor substrate.

The manufacturing method of the solar cell according to the embodiment of the present invention is effective in keeping the concentration of an impurity of the first conductivity type in the impurity region low when the first conductivity impurity region is formed on a principal surface side of a semiconductor substrate. For example, it is effective in the case of forming an impurity region of the first conductivity type having the concentration of an impurity of at most $1 \times 10^{18}$ cm$^{-3}$ when a monocrystalline silicon substrate is used as the semiconductor substrate.

Other Embodiment

Although the above has described solar cells and solar cell modules according to embodiments and variations of the present invention, the embodiments and the variations of the present invention are not limited to the above embodiments and variations. The embodiments and the variations of the present invention also encompass: embodiments achieved by applying various modifications conceivable to those skilled in the art to each embodiment; and embodiments achieved by optionally combining the structural elements and the functions of each embodiment without departing from the essence of the embodiments and the variations of the present invention.

Note that first principal surface 21 of semiconductor substrate 20 may be a back surface, and second principal surface 22 may be a light receiving surface in Embodiments 1 through 3 and Variations 1 through 3. In addition, the first conductivity type may be a p type and the second conductivity type may be an n type. Furthermore, solar cell 10A according to Embodiment 2 may employ the impurity concentration profile of second impurity region 24 and the impurity concentration profile of third impurity region 25 according to Variations 1 through 3.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. A solar cell, comprising:
 a semiconductor substrate of a first conductivity type which includes a first principal surface and a second principal surface on a back side of the first principal surface;
 a first semiconductor layer of the first conductivity type disposed above the first principal surface; and
 a second semiconductor layer of a second conductivity type disposed below the second principal surface, the second conductivity type being different from the first conductivity type, wherein
 the semiconductor substrate includes:
  a first impurity region of the first conductivity type;
  a second impurity region of the first conductivity type, which is an entire region between the first impurity region and the first principal surface and is a region including the first principal surface; and
  a third impurity region of the first conductivity type, which is an entire region between the first impurity region and the second principal surface and is a region including the second principal surface,
 the first impurity region and the second region are in contact with each other, and the first impurity region and the third impurity region are in contact with each other,
 a peak concentration of an impurity of the first conductivity type in the second impurity region is higher than a peak concentration of an impurity of the first conductivity type in the third impurity region,
 the peak concentration of the impurity of the first conductivity type in the third impurity region is higher than a peak concentration of an impurity of the first conductivity type in the first impurity region,
 a dose in a predetermined diffusion width of the second impurity region is greater than a dose in a predetermined diffusion width of the third impurity region,
 the semiconductor substrate is a monocrystalline silicon substrate,
 the first semiconductor layer and the second semiconductor layer are amorphous silicon layers,
 a concentration of an impurity of the first conductivity type in the first impurity region is $5 \times 10^{13}$ cm$^{-3}$ to $1 \times 10^{17}$ cm$^{-3}$,
 the peak concentration of the impurity of the first conductivity type in the second impurity region is $2 \times 10^{18}$ cm$^{-3}$ to $4 \times 10^{19}$ cm$^{-3}$, and the peak concentration of the impurity of the first conductivity type in the third impurity region is $1\times10^{18}$ cm$^{-3}$ to $2\times10^{19}$ cm$^{-3}$.

2. The solar cell according to claim 1, wherein
the first conductivity type is an n type, and
the second conductivity type is a p type.

3. A solar cell module, comprising:
a solar cell string in which a plurality of solar cells are electrically connected in series via a plurality of line members, wherein
each of the plurality of solar cells is the solar cell according to claim 1.

4. A solar cell, comprising:
a semiconductor substrate of a first conductivity type which includes a light receiving surface and a back surface;
a first semiconductor layer of the first conductivity type disposed in a first region below the back surface; and
a second semiconductor layer of a second conductivity type disposed in a second region different from the first region below the back surface, the second conductivity type being different from the first conductivity type, wherein:
the semiconductor substrate includes:
  a first impurity region of the first conductivity type;
  a second impurity region of the first conductivity type, which is an entire region within the semiconductor substrate between the first impurity region and the first semiconductor layer and is a separate region from the first semiconductor layer; and
  a third impurity region of the first conductivity type, which is an entire region within the semiconductor substrate between the first impurity region and the second semiconductor layer and is a separate region from the second semiconductor layer,
the second impurity region includes one part of the back surface, and the third impurity region includes an other part of the back surface,
a peak concentration of an impurity of the first conductivity type in the second impurity region is higher than a peak concentration of an impurity of the first conductivity type in the third impurity region,
the peak concentration of the impurity of the first conductivity type in the third impurity region is higher than a peak concentration of an impurity of the first conductivity type in the first impurity region, and
a dose in a predetermined diffusion width of the second impurity region is greater than a dose in a predetermined diffusion width of the third impurity region.

5. The solar cell according to claim 4, wherein
the semiconductor substrate is a monocrystalline silicon substrate, and
the first semiconductor layer and the second semiconductor layer are amorphous silicon layers.

6. The solar cell according to claim 4, wherein
the first conductivity type is an n type, and
the second conductivity type is a p type.

7. A solar cell module, comprising:
a solar cell string in which a plurality of solar cells are electrically connected in series via a plurality of line members, wherein
each of the plurality of solar cells is the solar cell according to claim 4.

8. The solar cell according to claim 1, wherein
the peak concentration of the impurity of the first conductivity type in the second impurity region is higher than the peak concentration of the impurity of the first conductivity type in the third impurity region.

9. The solar cell according to claim 1, wherein
the second impurity region has a thickness of 10 nm to 100 nm from the first principal surface, and
the third impurity region has a thickness of 10 nm to 100 nm from the second principal surface.

10. The solar cell according to claim 1, wherein
a dose amount of the impurity in the second impurity region is greater than a dose amount of the impurity in the third impurity region.

11. The solar cell according to claim 4, wherein
a dose amount of the impurity in the second impurity region is greater than a dose amount of the impurity in the third impurity region.

\* \* \* \* \*